(12) United States Patent
Arora et al.

(10) Patent No.: US 7,956,662 B2
(45) Date of Patent: Jun. 7, 2011

(54) FLIP-FLOP CIRCUIT WITH INTERNAL LEVEL SHIFTER

(75) Inventors: Sunny Arora, Noida (IN); Kumar Abhishek, Ghaziabad (IN); Mukesh Bansal, Noida (IN); Shilpa Gupta, Rohini (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/624,360

(22) Filed: Nov. 23, 2009

(65) Prior Publication Data

US 2010/0182063 A1 Jul. 22, 2010

(30) Foreign Application Priority Data

Jan. 16, 2009 (IN) ................. 79/DEL/2009

(51) Int. Cl.
*H03K 3/356* (2006.01)

(52) U.S. Cl. ........ 327/208; 327/203; 327/212; 327/218; 327/333; 326/80; 326/95; 326/98

(58) Field of Classification Search .......... 327/199–203, 327/208–214, 218, 223–225, 333; 326/62, 326/80, 81, 93–98

See application file for complete search history.

(56) References Cited

U.S. PATENT DOCUMENTS

| 6,081,153 | A  |   | 6/2000  | Hamada et al. |            |
|-----------|----|---|---------|---------------|------------|
| 6,351,173 | B1 | * | 2/2002  | Ovens et al.  | 327/333    |
| 6,563,357 | B1 | * | 5/2003  | Hsu et al.    | 327/212    |
| 6,762,957 | B2 | * | 7/2004  | Hsu et al.    | 365/189.05 |
| 7,132,856 | B2 | * | 11/2006 | Hsu et al.    | 326/81     |
| 7,443,223 | B2 | * | 10/2008 | Bajkowski et al. | 327/333 |
| 7,671,629 | B2 | * | 3/2010  | Zhang et al.  | 326/81     |
| 7,804,346 | B2 | * | 9/2010  | Park          | 327/208    |

* cited by examiner

*Primary Examiner* — Lincoln Donovan
*Assistant Examiner* — Patrick O'Neill
(74) *Attorney, Agent, or Firm* — Charles Bergere

(57) ABSTRACT

A flip-flop circuit with an internal level shifter includes an input stage, a clock input stage, an output stage and a level shifting stage. The output stage generates an output signal based on an input signal received by the input stage and a clock signal received by the clock input stage. The level shifting stage shifts-up the voltage level of the output signal.

7 Claims, 3 Drawing Sheets

- Prior Art -

FLIP-FLOP CIRCUIT WITH INTERNAL LEVEL SHIFTER

BACKGROUND OF THE INVENTION

The present invention relates generally to digital circuits, and more specifically, to flip-flops used in digital circuits.

Flip-flops are used as storage elements in digital circuits for storing data. A flip-flop circuit has an input stage for receiving a data input signal, a clock input for receiving a clock signal, and an output stage for generating an output signal. The output stage latches the input signal based on the active edge of the clock signal.

Various electrical components in a digital circuit may operate in different voltage domains. If the flip-flop circuit is connected to an electrical component that operates in a different voltage domain, a level shifter is required to shift-up or shift-down the voltage level of the output signal of the flip-flop circuit. A conventional flip-flop circuit 102 with an external level shifter 104 is illustrated in FIG. 1. The flip-flop circuit 102 includes an input terminal D 106, a clock input terminal CLK 108, an output terminal Q 110, and an inverted output terminal /Q 112. The level shifter 104 includes a first field effect transistor (FET) 114a, a second FET 114b, a third FET 116a, and a fourth FET 116b. The first FET 114a and the second FET 114b may be p-channel FETs (p-FET). The third FET 116a and the fourth FET 116b may be n-channel FETs (n-FET). The source terminals of the first and second FETs 114a and 114b are connected together. The gate terminal of the first FET 114a is connected to the drain terminal of the fourth FET 116b. The gate terminal of the second FET 114b is connected to the drain terminal of the third FET 116a. The output terminal Q 110 is connected to the gate terminal of the third FET 116a and the inverted output terminal /Q 112 is connected to the gate terminal of the fourth FET 116b.

The level shifter 104 shifts-up the output signal of the flip-flop circuit 102 and provides the level shifted output to the next stage of the digital circuit. However, such a flip-flop circuit with an external level shifter increases the chip area, thereby increasing the cost of fabrication. Moreover, use of an external level shifter increases the power consumption in an electronic circuit.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
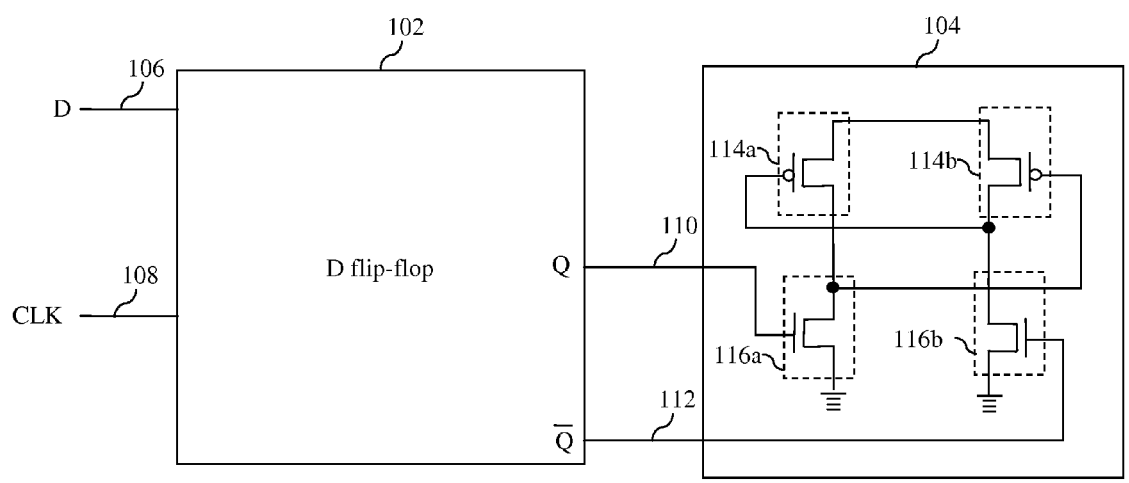
FIG. 1 is a schematic diagram illustrating a conventional flip-flop circuit with a level shifter.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a flip-flop circuit with an integrated level shifter is provided. The flip-flop circuit receives an input signal and a clock signal, and generates an output signal and an inverted output signal. A clock input stage is provided for receiving the clock signal and the input signal, and clocking the input signal. The flip-flop circuit further includes a first inverter that inverts the clocked (or clock controlled) input signal. An output stage is connected to the first inverter and generates the output signal and the inverted output signal. The output stage includes a first field effect transistor (FET) and a second FET connected in series. The inverted clocked input signal is applied to the gate of the second FET. The inverted output signal is generated at the drain of the second FET. The flip-flop circuit further includes a level shifting stage connected to the inverter and the output stage. The level shifting stage includes a third FET and a fourth FET. The source of the third FET and the drain of the fourth FET are connected to the gate of the first FET. The clocked input signal is applied to the gates of the third and the fourth FETs. The output signal is fed back to the source of the fourth FET. The level shifting stage further includes a fifth FET connected in series with the first FET. The inverted clocked input signal is applied to the gate terminal of the fifth FET. An additional inverter is provided that has an input terminal connected to the output of the first inverter and the gates of the second and fifth FETs, while the output of the additional inverter is connected to the input of the first inverter.

In another embodiment of the present invention, a master slave flip-flop circuit is provided. The master slave flip-flop circuit includes a master stage and a slave stage. The master stage receives an input signal and a clock signal. The clock signal controls the master input signal and generates a clocked or controlled input signal. The slave stage receives the controlled input signal and generates an inverted controlled input signal. The master slave flip-flip circuit further includes an output stage that is connected to the slave stage. The output stage generates an output signal and an inverted output signal. The output stage includes first and second field effect transistors (FET) that are connected in series. The inverted controlled input signal is applied to the gate of the second FET. The inverted output signal is generated at a node connecting the drain of the first FET with the drain of the second FET. The flip-flop circuit further includes a level shifting stage connected to the slave stage and the output stage. The level shifting stage includes a third FET and a fourth FET. The source of the third FET and the drain of the fourth FET are connected to the gate of the first FET. The controlled input signal is applied to the gates of the third and the fourth FETs. The output signal is fed back to the source of the fourth FET. The level shifting stage further includes a fifth FET connected in series with the first FET, and having a gate connected to the gate of the second FET.

Embodiments of the present invention provide a flip-flop circuit. The flip-flop circuit includes both an output stage and a level shifting stage. The first FET, the second FET and the inverter from the output stage are used with the level shifting stage to level shift the output of the flip-flop circuit. This eliminates the need for a separate level shifter, thereby saving chip area. Further, a high voltage source is used for back-biasing the internal components of the master stage and the slave stage of the master slave flip-flop. This reduces the leakage power of the master slave flip-flop circuit.

Figure 2:
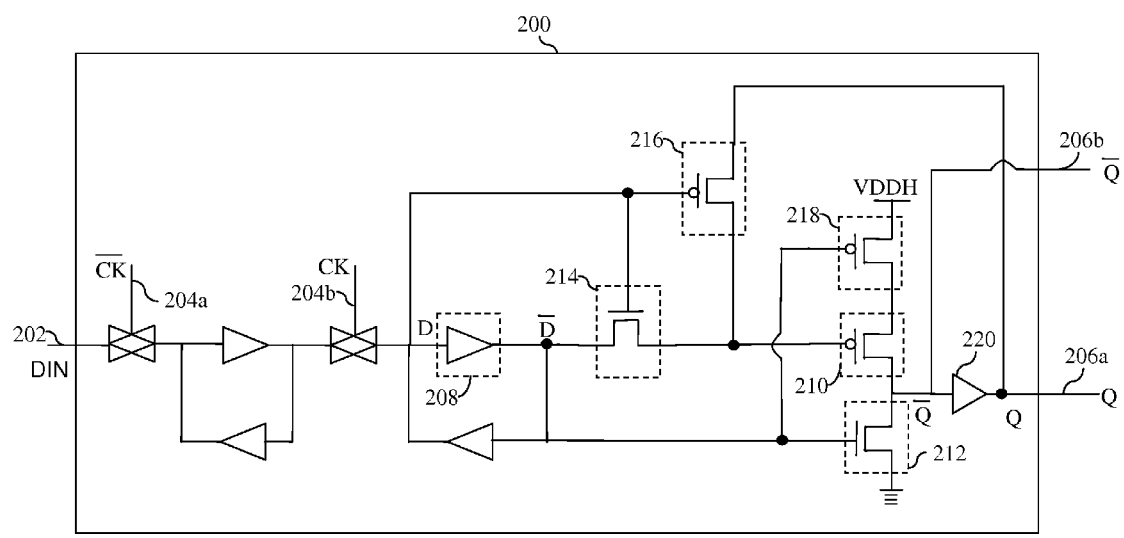
FIG. 2 is a schematic diagram illustrating a flip-flop circuit in accordance with an embodiment of the present invention.

Referring now to FIG. 2, a schematic diagram illustrating a flip-flop circuit 200 is shown, in accordance with an embodiment of the present invention. The flip-flop circuit 200 includes an input terminal 202, clock input stages 204a and 204b, an output terminal 206a, an inverted output terminal 206b, a first inverter 208 (a plurality of inverters may be used here, but for clarity only one is shown), a first field effect transistor (FET) 210, a second FET 212, a third FET 214, a fourth FET 216, a fifth FET 218, and a logic NOT gate (or inverter) 220. The first FET 210, the second FET 212 and the logic NOT gate 220 comprise an output stage of the flip-flop circuit 200. The third FET 214, the fourth FET 216, and the fifth FET 218 comprise a level shifting stage of the flip-flop circuit 200. The use of only three devices by the level shifting stage maximizes internal node usage.

The flip-flop circuit 200 receives an input signal DIN at the input terminal 202. The clock input stages 204a and 204b receive the input signal DIN and generate a clocked input signal D that is provided to the first inverter 208. The first inverter 208 inverts the clocked input signal, thereby generating an inverted signal /D. A clock signal CK (and inverted clock signal /CK) is provided at the clock input stages 204a and 204b. As is known by those of skill in the art, the clock signal CK (and /CK) controls the input signal DIN.

The output stage generates an output signal Q and an inverted output signal /Q based on the inverted signal /D. The first FET 210 and the second FET 212 are connected in series. The inverted signal /D is applied to the gate of the second FET 212. The source of the second FET 212 is connected to a low potential (e.g., ground). The inverted output signal /Q is generated at a node between the drain of the first FET 210 and the drain of the second FET 212. The logic NOT gate 220 is also connected to the drain terminal of the second FET 212 and inverts the inverted output signal /Q to generate the output signal Q.

The level shifting stage is connected to the inverter 208 and the output stage. More particularly, the source of the third FET 214 and the drain of the fourth FET 216 are connected to the gate of the first FET 210. The clocked input signal D is applied to the gates of the third and the fourth FETs 214 and 216, respectively, and the output of the first inverter (/D) 208 is applied to the drain of the third FET 214. In addition, the output signal Q is fed back to the source of the fourth FET 216. The fifth FET 218 is connected in series with the first FET 210. The gate of the fifth FET 218 is connected to the output of the first inverter 208 and receives the inverted signal /D, while the source of the fifth FET 218 is connected to a high voltage source (VDDH).

The operation of the flip-flop circuit 200 may be explained using exemplary values of the clocked input signal D, the inverted signal /D, the output signal Q, and the inverted output signal /Q. In one example, the signal D is at 0.8 volt (V), the inverted signal /D is at 0V, the output signal Q is at 0V, and the inverted output signal /Q is at 1.2V. When the clocked input signal D switches from 0.8V to 0V, the inverted signal /D switches to 0.8V. Hence, the second FET 212 is turned on. The voltage at the gate of the fifth FET 218 also goes to 0.8V. The source of the fifth FET 218 is at 1.2V. Therefore, the fifth FET 218 is partially on and the current flowing through the fifth FET 218 remains low. Since the second FET 212 is on, it acts as a strong pull-down network and drives the inverted output signal /Q to 0V. Thereafter, the logic NOT gate 220 inverts the inverted output signal /Q to generate the output signal Q of 1.2V. The output signal Q at 1.2V drives the first FET 210 to a cut-off region, thus blocking sub-threshold leakage from the fifth FET 218.

In another example, the clocked input signal D is at 0.0V, the inverted signal /D is at 0.8V, the output signal Q is at 1.2V, and the inverted output signal /Q is at 0V. When the clocked input signal D switches from 0.0V to 0.8V, the inverted signal /D switches to 0.0V, which drives the gate of the third FET 214 to 0.8V, and the third FET switches to a linear region. Therefore, the terminal of the first FET 210 is discharged to 0V. Simultaneously, since the inverted signal /D is 0V, the gates of the second and fifth FETs 212 go to 0V, which turns on the fifth FET 218 and turns off the second FET 212. This drives the inverted output signal /Q to 1.2V. The logic NOT gate 220 inverts the inverted output signal /Q to generate the output signal Q of 0V. Since the output signal Q is 0V, the fourth FET 216 is cut off and the leakage current is stopped, which saves power.

In one embodiment of the present invention, the second FET 212 and the third FET 214 are NMOS FETs (n-FETs) and the first, fourth and fifth FETs 210, 216, and 218 are PMOS FETs (p-FETs). In one embodiment of the present invention, the flip-flop circuit 200 is a D-type flip-flop circuit. In another embodiment of the present invention, the flip-flop circuit 200 is a master slave flip-flop circuit. In yet other embodiments of the present invention, the plurality of inverters, such as the inverter 208, are back-biased. Further, the plurality of inverters, such as the inverter 208, may operate at a low voltage (VDDL).

Figure 3:
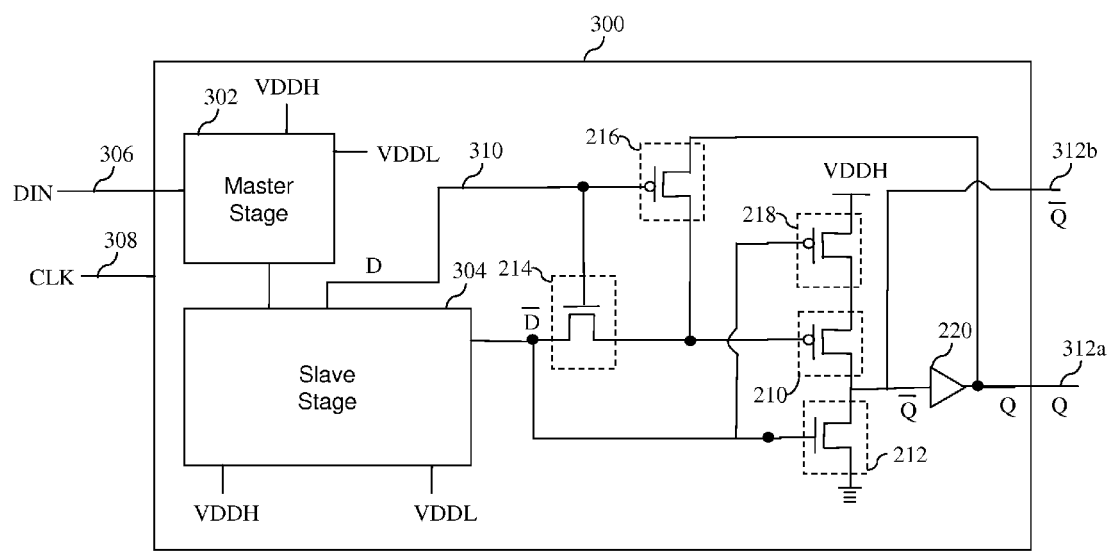
FIG. 3 is a schematic diagram illustrating a master slave flip-flop in accordance with another embodiment of the present invention.

Referring now to FIG. 3, a schematic diagram illustrating a master slave flip-flop circuit 300 is shown, in accordance with an embodiment of the present invention. The master slave flip-flop circuit 300 includes a master stage 302, a slave stage 304, an input terminal 306, a clock input terminal 308, an output terminal 312a, an inverted output terminal 312b, a first field effect transistor (FET) 210, a second FET 212, a third FET 214, a fourth FET 216, a fifth FET 218, and a logic NOT gate (inverter) 220. The first FET 210, the second FET 212, and the logic NOT gate 220 form an output stage of the master slave flip-flop circuit 300. The third FET 214, the fourth FET 216, and the fifth FET 218 form a level shifting stage of the master slave flip-flop. As with the flip-flop circuit 200, only three additional devices are used for level shifting so internal node usage is optimized. A high voltage source (VDDR) and a low voltage source (VDDL) are provided to both the master stage 302 and the slave stage 304. The high voltage source may be used for back-biasing the internal components of the master and slave stages 302 and 304 to save on leakage power.

A data input signal DIN is provided at the input terminal 306 and received by the master stage 302, which generates a controlled input signal D. The slave stage 304 is connected to the master stage 302 and receives the controlled input signal D and generates an inverted, controlled input signal /D. A clock signal CLK is provided at the clock input terminal 308. The clock signal CLK controls the data input signal DIN. Although the clock control is not shown, master-slave type flip-flops and the clock control logic therefor are well known to those of skill in the art so a detailed description thereof is not required for a complete understanding of the invention.

The output stage generates an output signal Q and an inverted output signal /Q, based on the controlled input signal D (and the clock signal CLK). The first and second FETs 210 and 212 are connected in series. The inverted, controlled input signal /D is applied to the gate of the second FET 212. The source of the second FET 212 is connected to ground. The inverted output signal /Q is generated at a node connecting the drain of the first FET 210 and the drain of the second FET 212. The logic NOT gate 220 is also connected to the node between the first and second FETs 210 and 212 and inverts the inverted output signal /Q to generate the output signal Q.

The level shifting stage is connected to the slave stage 304 and the output stage. More particularly, the source of the third FET 214 and the drain of the fourth FET 216 are connected to the gate of the first FET 210. The controlled input signal D is applied to the gates of the third and the fourth FETs 214 and 216, respectively. The output signal Q is fed back to the source of the fourth FET 216. The fifth FET 218 is connected in series with the first FET 210. The inverted, controlled input signal /D is applied to the gate of the fifth FET 218 while the source of the fifth FET 218 is connected to the high voltage source (VDDR).

The operation of the master slave flip-flop circuit 200 may be explained using exemplary values of the controlled signal D, the inverted, controlled signal /D, the output signal Q and the inverted output signal /Q. In this example, the controlled input signal D is at 0.8 volt (V), the inverted, controlled input signal /D is at 0V, the output signal Q is at 0V, and the inverted output signal /Q is at 1.2V. When the controlled input signal D switches from 0.8V to 0V, the inverted input signal /D switches to 0.8V. Hence, the second FET 212 is turned on. The voltage at the gate of the fifth FET 218 goes to 0.8V. The source of the fifth FET 218 is at 1.2V. Therefore, the fifth FET 218 is partially turned on and the leakage current flowing through the fifth FET 218 remains low. Since the second FET 212 is on, it acts as a strong pull-down network and drives the inverted output signal /Q to 0V. Thereafter, the NOT gate 220 inverts the inverted output signal /Q to generate the output signal Q at 1.2V. The output signal Q at 1.2V drives the first FET 210 to a cut-off region, which blocks the sub-threshold leakage from the fifth FET 218.

In another example, the controlled input signal D is at 0.0V, the inverted, controlled input signal /D is at 0.8V, the output signal Q is at 1.2V, and the inverted output signal /Q is at 0V. When the controlled input signal D switches from 0.0V to 0.8V, the inverted controlled input signal /D switches to 0.0V. The controlled input signal D drives the gate of the third FET 214 to 0.8V and the third FET 214 switches to a linear region. Therefore, the gate of the first FET 210 is discharged to 0V. Simultaneously, since the inverted controlled input signal /D is at 0V, the gates of the second and fifth FETs 212 and 218 are at 0V. Thereafter, the second FET 212 and the fifth FET 218 are turned on, thereby turning off the second FET 212, which drives the inverted output signal /Q to 1.2V. The NOT gate 220 inverts the inverted output signal /Q to generate the output signal Q at 0V. Since the output signal Q is at 0V, the fourth FET 216 is cut off and the leakage current is stopped, thus saving power.

In various embodiments of the present invention, the master stage 302 and the slave stage 304 may include a plurality of NOT gates (not shown). The plurality of NOT gates may be back-biased. In an embodiment of the present invention, the second FET 212 and the third FET 214 may be NMOS FETs (n-FETs) and the first, fourth and fifth FETs 210, 216 and 218 may be PMOS FETs (p-FETs).

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A flip-flop circuit that receives an input signal and a clock signal and generates an output signal and an inverted output signal, the flip-flop comprising:
   a clock input stage that receives the clock signal and the input signal, wherein the clock signal controls the input signal, and generates a clocked input signal;
   an inverter that receives the clocked input signal and generates an inverted clocked input signal;
   an output stage connected to the inverter for generating the output signal and the inverted output signal, the output stage comprising a first field effect transistor (FET) and a second FET connected in series, wherein the inverted input signal is applied to the gate of the second FET, and the inverted output signal is generated at the drain of the second FET; and
   a level shifting stage connected to the inverter and the output stage, comprising:
       a third FET and a fourth FET, wherein the clocked input signal is applied to the gates of the third and fourth FETS, the source of the third FET and the drain of the fourth FET are connected to the gate of the first FET, and the output signal is fed back to the source of the fourth FET; and
       a fifth FET connected in series with the first FET, wherein the inverted input signal is applied to the gate of the fifth FET.

2. The flip-flop circuit of claim 1, wherein the source of the fifth FET is connected to a high voltage source.

3. The flip-flop circuit of claim 2, wherein the output stage further comprises a logic NOT gate for inverting the inverted output signal to generate the output signal.

4. The flip-flop circuit of claim 3, wherein at least one of the second FET and the third FET is a NMOS FET.

5. The flip-flop circuit of claim 3, wherein at least one of the first FET, the fourth FET and the fifth FET is a PMOS FET.

6. The flip-flop circuit of claim 3, wherein the flip-flop circuit is a D-type flip-flop.

7. The flip-flop circuit of claim 3, wherein the flip-flop circuit is used in a master-slave flip-flop.

* * * * *